United States Patent
Abe et al.

(10) Patent No.: US 7,255,837 B2
(45) Date of Patent: Aug. 14, 2007

(54) ELECTRONIC DEVICE AND THERMAL TYPE FLOW METER ON VEHICLE

(75) Inventors: Hiroyuki Abe, Naka (JP); Shinya Igarashi, Naka (JP)

(73) Assignees: Hitachi, Ltd., Tokyo (JP); Hitachi Car Engineering Co., Ltd., Hitachinaka-shi (JP)

( * ) Notice: Subject to any disclaimer, the term of this patent is extended or adjusted under 35 U.S.C. 154(b) by 365 days.

(21) Appl. No.: 10/247,628

(22) Filed: Sep. 20, 2002

(65) Prior Publication Data

US 2003/0087448 A1    May 8, 2003

(30) Foreign Application Priority Data

Nov. 7, 2001   (JP) .............................. 2001-341350

(51) Int. Cl.
G01N 25/42   (2006.01)
G01N 25/20   (2006.01)
G01N 25/40   (2006.01)
G01F 1/68    (2006.01)
G01F 1/684   (2006.01)
G01L 1/04    (2006.01)

(52) U.S. Cl. .............. 422/104; 73/204.22; 422/51; 422/83; 436/147; 436/181

(58) Field of Classification Search .............. 422/51, 422/83, 99, 104; 73/204.22; 436/147, 181
See application file for complete search history.

(56) References Cited

U.S. PATENT DOCUMENTS

| | | | | |
|---|---|---|---|---|
| 3,898,422 A | * | 8/1975 | Fuller et al. .............. 219/201 |
| 4,011,360 A | * | 3/1977 | Walsh ........................ 428/402 |
| 4,330,637 A | * | 5/1982 | Wong ......................... 524/720 |
| 4,517,837 A | * | 5/1985 | Oyama et al. ............. 73/202.5 |
| 4,939,014 A | * | 7/1990 | Anderson et al. ............. 428/76 |
| 4,944,916 A | * | 7/1990 | Franey ........................ 422/8 |
| 4,967,316 A | * | 10/1990 | Goebel et al. .............. 361/816 |
| 5,075,038 A | * | 12/1991 | Cole et al. .................. 252/514 |
| 5,186,044 A | * | 2/1993 | Igarashi et al. ........... 73/118.2 |
| 5,210,941 A | * | 5/1993 | Turek et al. ................. 29/852 |
| 5,470,622 A | * | 11/1995 | Rinde et al. ............... 428/34.9 |
| 5,544,523 A | * | 8/1996 | Uchiyama et al. ......... 73/118.2 |
| 5,686,162 A | * | 11/1997 | Polak et al. ................ 428/76 |
| 5,756,893 A | * | 5/1998 | Kondo et al. ............ 73/204.22 |
| 5,877,553 A | * | 3/1999 | Nakayama et al. ......... 257/708 |
| 6,012,432 A | * | 1/2000 | Igarashi et al. ............. 123/494 |

(Continued)

FOREIGN PATENT DOCUMENTS

JP    3-217476    * 9/1991

(Continued)

*Primary Examiner*—Arlen Soderquist
(74) *Attorney, Agent, or Firm*—Crowell & Moring LLP

(57) ABSTRACT

An airtight configuration for keeping down the permeation of corrosive gas from silicone adhesive, and for preventing corrosive gas from entering the case.

An electronic device mounted on vehicle. The electronic device has at least one of a portion connecting components, and a portion sealing the clearance or hole where exists in the electronic device.

The at least one of the connection portion and the seal portion is constituted by using adhesive or sealant which has at least one of a function adsorbing corrosive gas and a function trapping corrosive gas with chemical reaction.

A car-mounted electronic device characterized by reduced permeation of corrosive gas into a case and high reliability.

19 Claims, 6 Drawing Sheets

U.S. PATENT DOCUMENTS

| | | | |
|---|---|---|---|
| 6,070,462 A * | 6/2000 | Igarashi et al. | 73/204.22 |
| 6,132,645 A * | 10/2000 | Hedges | 252/510 |
| 6,136,128 A * | 10/2000 | Chung | 156/235 |
| 6,176,131 B1 * | 1/2001 | Hecht et al. | 73/204.26 |
| 6,206,066 B1 * | 3/2001 | Imanishi et al. | 156/356 |
| 6,261,679 B1 * | 7/2001 | Chen et al. | 428/317.9 |
| 6,297,564 B1 * | 10/2001 | Chung | 257/783 |
| 6,427,668 B1 * | 8/2002 | Igarashi et al. | 123/494 |
| 6,428,650 B1 * | 8/2002 | Chung | 156/250 |
| 6,516,785 B1 * | 2/2003 | Nakada et al. | 123/494 |
| 6,588,268 B1 * | 7/2003 | Yamagishi et al. | 73/204.26 |
| 6,604,417 B1 * | 8/2003 | Koike et al. | 73/204.22 |
| 6,622,555 B2 * | 9/2003 | Straight et al. | 73/202.5 |
| 6,640,627 B2 * | 11/2003 | Sato et al. | 73/204.22 |
| 6,679,113 B2 * | 1/2004 | Uramachi | 73/204.22 |
| 6,708,560 B2 * | 3/2004 | Watanabe et al. | 73/204.22 |
| 6,708,834 B2 * | 3/2004 | Hagerman, III | 220/4.02 |
| 6,725,715 B2 * | 4/2004 | Igarashi et al. | 73/204.22 |
| 6,997,051 B2 * | 2/2006 | Okazaki et al. | 73/204.22 |
| 2002/0049274 A1 * | 4/2002 | Azechi et al. | 524/440 |

FOREIGN PATENT DOCUMENTS

| | | | |
|---|---|---|---|
| JP | 5-79878 | * | 3/1993 |
| JP | 6-011373 | | 1/1994 |
| JP | 06-011373 A | | 1/1994 |
| JP | 07-062242 | | 3/1995 |
| JP | 08-236271 A | | 9/1996 |
| JP | 2001-123921 | * | 5/2001 |
| JP | 2001-235356 | * | 8/2001 |

* cited by examiner

ELECTRONIC DEVICE AND THERMAL TYPE FLOW METER ON VEHICLE

BACKGROUND OF THE INVENTION

1. Field of the Invention

The present invention relates to an electronic device mounted on a vehicle. Such as an electronic device, there are various sensors and a control unit installed in an engine room. More particularly, the present invention is relates to the configuration of sealing various sensors and to the configuration of sealing the control unit. Various sensors have sensing elements for detecting various physical quantities and electrical circuits for controlling the sensing elements, and output various quantities as electrical signals. The control unit has a microprocessor that controls various states of a vehicle in response to electrical signals of the sensors.

2. Prior Art

An example of the sealing configuration of the above-mentioned type is found in the thermal type flow meter disclosed in Japanese Application Patent Laid-Open Publication No. Hei 06-11373. This type of the configuration is used in physical quantity detecting apparatus and controller in engine room.

It will be described below using an example of the thermal type air flow meter in the Japanese Application Patent Laid-Open Publication No. Hei 06-11373. These physical quantity sensors are used under the severe environmental conditions of high temperature, low temperature and high humidity. The air flow sensor has members formed by the so called insert-molding with resin, wherein the terminal for holding the heating resistor and thermo sensitive resistor and the base made of aluminum characterized by excellent thermal conductivity are inserted in said molded member. The drive circuit for receiving electrical signals of the heating resistor and the thermo sensitive resistor and for outputting them to the outside control unit is bonded to the base. The drive circuit is installed in the case made of resin. In this sealing configuration, the cover for covering the case is bonded to the upper surface of the case. Silicone adhesive is mainly used for connection between the drive circuit and the base, and is also used in many cases for connection between the base and the case. Further, epoxy adhesive or silicone adhesive is used for connection between the case and cover.

A silicone component which contains antibacterial and mildew-proof in silicone adhesive is disclosed in Japanese Application Patent Laid-Open Publication No. Hei 07-62242, wherein the silicone composition is mixed with Zeolite containing 0.1 to 15 wt % silver ion.

SUMMARY OF THE INVENTION

[Problems to be Solved by the Invention]

According to the prior art, silicone adhesive is used for connection between the metallic base for fixing the drive circuit and the case made of resin, and the drive circuit is hermetically sealed. However, the silicone adhesive itself has a physical property of allowing gas to pass by. So if the drive circuit is configured so that the base and the case are bonded by adhesive, then corrosive gas will enter the case through the silicone-sealed portion.

Many of the electronic devices on vehicle used under severe working conditions consist of a hybrid IC substrate. The hybrid IC substrate is configured in such a way that conductors for electric wiring and resistors are printed or burnt on the surface of such an inorganic substance as alumina and glass ceramic, further, capacitors, diodes and semiconductor integrating circuits are mounted on the surface of the inorganic substance. The corrosive gas has reached the case after passing through the silicone adhesive. Thereby, the corrosive gas reacts chemically to silver or silver alloy forming the conductor, and silver sulfate is generated, consequently there is the possibility of the conductive wire being damaged.

The present invention is to prevent permeation of corrosive gas in bonded and sealed portions existing in electric device on vehicle. For example the adhesive for connection between a metallic base and a resin-made case is the silicone adhesive that keeps advantage of excellent viscous property, excellent balance of mechanical strength and elongation and superb reliability of the silicone adhesive. Further the silicone adhesive has the function of preventing permeation of corrosive gas such as sulfur gas or sulfur compound gas including sulfurous acid gas, hydrogen sulfide gas that accelerate corrosion especially for a drive circuit of the electronic device. Or the adhesive has the function of accelerating delay of permeation. Thereby overcoming the problem of gas permeability as disadvantage of the sealant. Use of this adhesive prevents corrosive gas from entering the case, thereby preventing corrosion of the conducting material of a drive circuit and ensuring a highly reliable electronic device on vehicle.

[Means for Solving the Problems]

The above object can be attained by the inventions described as claims.

For example, to provide the function that resists permeation of corrosive gas without losing the viscoelastic property of silicone adhesive, activated carbon for adsorbing corrosive gas in addition to the ordinary silicon dioxide is added as filler to the silicone polymer which dimethyl vinyl polysiloxane or methyl vinyl phenyl polysiloxane is used as a base polymer. Especially porous hard charcoal and activated carbon made from palm-shell having been burnt at a temperature of 1,000° C. or more are effective activated carbon. The above object also can be attained by compounding a metallic substance as filler which is easy to react chemically to sulfur-based gas such as Ag, Fe Co, Ni, Cu. Namely said metallic substance functions as trap agent. Here, the trap agent is the substance which reacts chemically to corrosive gas and traps the generated chemical compound in resin.

DETAILED DESCRIPTION OF THE INVENTION

[Description of the Preferred Embodiments]

The following describes the embodiments of the present invention to give more specific explanation of the present invention. The present invention is not restricted by the description of these embodiments.

Figure 1:
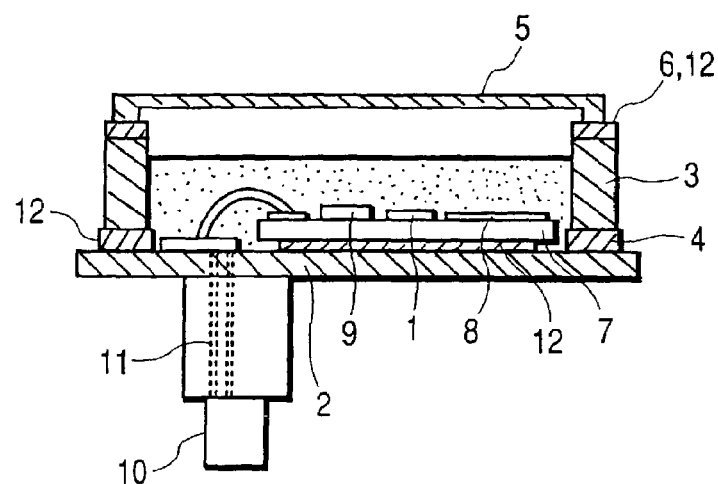
FIG. 1 is across sectional view of the configuration of an electronic device on vehicle showing the characteristics of the present invention.
Figure 2:
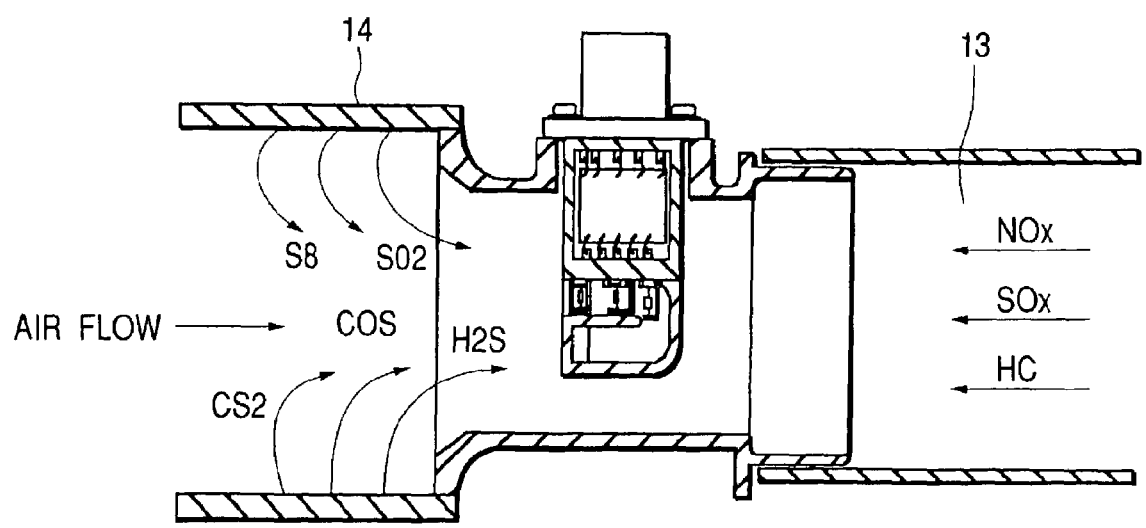
FIG. 2 is a drawing representing an environment of an electronic device on vehicle.

The following describes the configuration of the electronic device mounted on vehicle, the operating environment thereof and problems, with reference to FIG. 1, FIG. 2. The electrical device can broadly be classified into a sensor and a control unit. The control unit functions as fuel controller and ignition coil controller. The various sensors detect the physical quantities of intake airflow rate, air temperature, atmospheric pressure and boost pressure etc. The control unit has a function of receiving signals and controlling combustion status in the cylinder. The igniter and coil are for controlling the ignition time inside the cylinder. The features common to the configuration of the electronic device mounted on vehicle are that the device has an electronic drive circuit 1 or an electronic control device. A metallic base 2 supports these circuits. The case 3 installing the electronic device circuit or the electronic control circuit is fixed on the base 2 by bonding 4. Further, the cover 5 for covering the opening of the case 3 is bonded to the upper surface of the case 3. The electronic drive circuit 1 or electronic control circuit is constituted by a hybrid IC substrate. The hybrid IC substrate is configured in such a way that wires (conductors) 8 of the circuit and resistors are printed and burnt on the surface of a substrate 7 made of such an inorganic substance as ceramic, and capacitors, diodes and semiconductor IC circuit are mounted thereon on the surface. To accelerate heat radiation from the hybrid IC substrate 9, the hybrid IC substrate 9 is bonded to the metallic base 2 by means of silicone adhesive. A metal having high thermal conductivity, especially aluminum, is often used as metallic base 2 in order to serve as a heat sink. The case 3 incorporating the hybrid IC board 9 and cover 5 protecting the upper surface of case 3 are formed integral with the connector serving as an interface with the output signal of the electronic drive circuit 1. Terminals 11 consisting of the conductive member responsible for transmission of electric signals are fixed into the plastic forming the case 3 by insert-molding. This configuration is often adopted. Here the sensor detects such the physical quantities as intake air temperature, intake airflow rate, boost pressure etc. The sensor is configured in such a way that a sensing element 10 is installed outside or in the opening of the case, and is connected to the electronic drive circuit 1 via terminal 11. As shown in a sigh 4, the case 3 is bonded to the base 2, and as shown in sigh 4, the cover 5 is also bonded 6 to the case 3. In many electronic devices on vehicle, resins characterized by excellent injection molding properties such as polybutylene terephthalate (PBT), polyphenylenesulfide (PPS), nylon 6, nylon 11 and nylon 12 are used as resin members forming the case 3 and cover 5.

Here, coefficients of linear expansion of the case 3 and the base 2 are much different from each other, so viscoelastic elastic adhesive such as silicone 12 is often used for adhesion or sealing 4. The case 3 and cover 5 are bonded with an epoxy adhesive if they are made of the same material, and with silicone adhesive 12 if they are made of different materials in many cases.

In many of the electronic devices on vehicles discussed above, silicone adhesive 12 is often utilized for bounding between parts or components.

However, silicone adhesive 12 has disadvantages, depending on the characteristics peculiar to silicone resin. In the engine room of the vehicle with an electronic device mounted thereon, burnt gas is blown back from the engine, and unburnt gas is returned. The adhesive is exposed to such the atmosphere 13 of stagnant hydrocarbon as intake air passage. Inside the engine room, there are a large number of such products as rubber ducts and hoses containing sulfur.

Such products are laid out in greater numbers in engine constituents. The engine internal temperature reaches the level of 100° C. or more in some of the electronic devices. In this case, sulfur-containing gas or Sulfur compound gas 14 gushes out from a group of products vulcanized with sulfur such as rubber dust and hose 26. These sulfur gases often change in a environment, and, in some cases, there are mixtures of gases with hydrocarbon 13 and others resulting from blowing back of combustion and return of unburnt gas as mentioned above. An electronic device highly resistant to these corrosive gases must be manufactured in order to maintain product reliability, for the following reason: In these car-mounted electronic devices (electronic devices on vehicle), silver or silver alloy is often used to form a conductive wire 8 on the ceramic IC board 7 of many electronic drive circuits 1. When corrosive gas, especially sulfur gas or sulfur compound gas, enters the case 3, the wire made of silver or silver alloy serving as a conductive wire 8 may be corroded by vulcanization, and the wire 8 of electronic drive circuit 1 may be disconnected, with the result that the electronic drive circuit 1 may fail to operate.

Silicone adhesive 12 often used in a car-mounted electronic device has physical properties inherent to silicone resin; namely, it has a high gas permeability. Many of the industrial high molecular materials of poly-bondage have low gas permeability, and can be classified as gas shields. Polyamide (nylon, etc.) and, saturated polyester resin groups (PBT, PET, etc.) have a low gas permeability which does not raise any problem in practical sense. However, the polymer of silicone resin is formed by siloxane bond where silicone (Si) and oxygen (O) are combined in a straight chain. Since siloxane bond (—Si—O—Si—) has a large intermolecular distance, it has a high degree of flexibility, a low steric hindrance in molecular rotation and small intermolecular force, hence a high degree of gas permeability. Because of these physical properties, the following problem occurs: Corrosive gas 14 passes through the portion 4 adhered and sealed with adhesive 12, even though this is the sealed portion of a car-mounted electronic device exposed to the environment of corrosive gas, as described above. Corrosive gas 14 then enters the case 3, and the conductive wire 8 made of silver or silver compound formed on the surface of the electronic drive circuit 1 is corroded by vulcanization in the final stage.

Concerning the sealing structure of the electronic device on vehicle of the present invention, silicone adhesive 12 having a high gas permeability is given the function that corrosive gas is trapped or adsorbed into the silicone resin, whereby the corrosive gas does not allow to enter the case 3. Namely, the sealing structure is provided by the silicone adhesive with preventing corrosive gas. For example, corrosive gas is trapped by chemical reaction in the silicone adhesive. Thereby the electronic drive circuit 1 is protected against corrosive gas.

The following describes the configuration of the silicone adhesive of the present invention.

Figure 3:
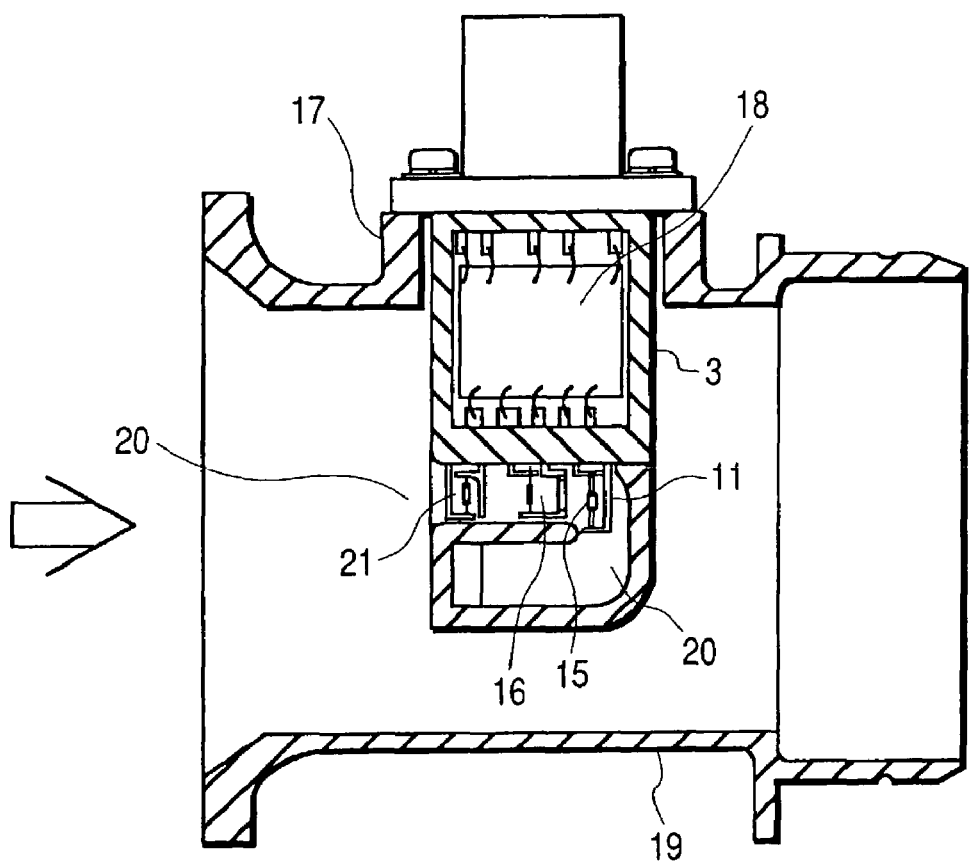
FIG. 3 is a drawing representing the configuration of a thermal type flow meter.
Figure 4:
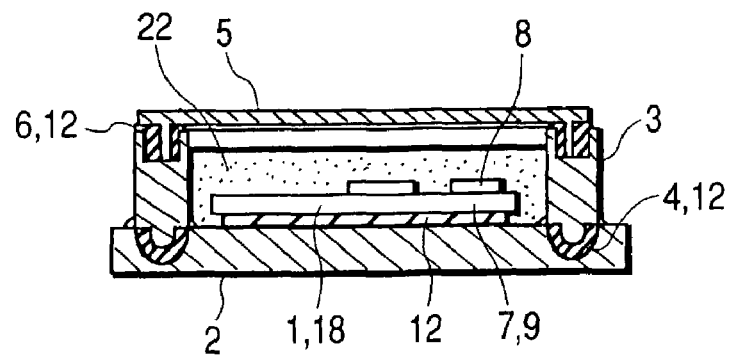
FIG. 4 is a cross sectional view representing the configuration of a thermal type flow meter.

There are a great number of car-mounted electric device types, and it is difficult to describe all these types. The following will take up representative types of electronic device on vehicle, and will describe the configuration of some examples of the thermal type flow meter for measuring intake airflow rate shown in FIG. 3, as well as embodiments of the present invention. First, a brief description of the air flow meter will be given below. FIGS. 3 and 4 are cross sectional views showing the configuration of the thermal type flow meter.

The thermal type flow meter is a sensor for measuring intake airflow that is rapidly coming into use in the market in recent years. Thermal type air flow meter 17 has a heating resistor 15 and a thermo sensitive resistor 16. The heating resistor 15 is so controlled by a temperature control circuit 18 that the heating resistor always has a constant difference in temperature from the thermo sensitive resistor 16 for measuring air temperature. Since the heating resistor 15 is installed in the flow of air, the surface of the heating resistor 15 becomes heat radiation that radiates heat into the flow of air, namely, a heat transfer surface. The heat removed to airflow due to this heat transfer is converted into electrical signals, whereby airflow rate is measured. The overall constitution is designed as follows. The body 19 is holding the thermal type flow meter 17 while introducing intake air. The heating resistor 15, the thermo sensitive resistor 16 and an intake air temperature sensor 21 are arranged on the sub-path 20 where part of the total airflow enters. These resistor elements and temperature control circuit 18 transmit electrical signals via the terminal 11 embedded in the case 3. The specific configuration will be described below. The structural base of the thermal type flow meter 17 is provided by the base 2 for radiating self-generated heat of the power device such as power transistor. The base 2 is often made of the metallic material having high thermal conductivity, and aluminum is much used as this material. The hybrid IC substrate is bonded on the surface of the base 2 by silicone adhesive. The hybrid IC substrate is configured in a such way that conductive wires 8 and resistors are formed by printing on the surface of a ceramic IC board, further, semiconductors, capacitors and diodes is mounted thereon. The case 3 and connector are so molded as to be integrated. The connector is used as an interface for transmitting sensor signals to the outside or supplying the circuit drive power from the outside. The case 3 is adhered and sealed portion 4 by silicone adhesive 12 on the base 2. After the sensor output characteristics and others have been adjusted under this conditions, silicone gel 22 as a protective film of the hybrid IC substrate 9 is poured into the case 3. The upper surface of the case 3 is covered by the cover 5. The case 3 and the cover 5 are bonded by a silicone adhesive or epoxy adhesive 12, this adhesive 12 becomes seal portion 6.

As described above, the silicone adhesive 12 used for adhering many kinds of members has high gas permeability. When used under highly corrosive conditions, gas will enter the case 3 through the adhered or sealed portion 4. To protect the parts mounted on the hybrid IC substrate 9 and conductive wire 8 against corrosion, it is necessary to improve the silicone adhesive in such a way that corrosive gas is prevented from passing through the silicone adhesive or is trapped or adsorbed by the silicone adhesive. Thereby, it is enable to product the electronic device on vehicle including a thermal type flow meter 17 and having high reliability against corrosion.

Figure 5:
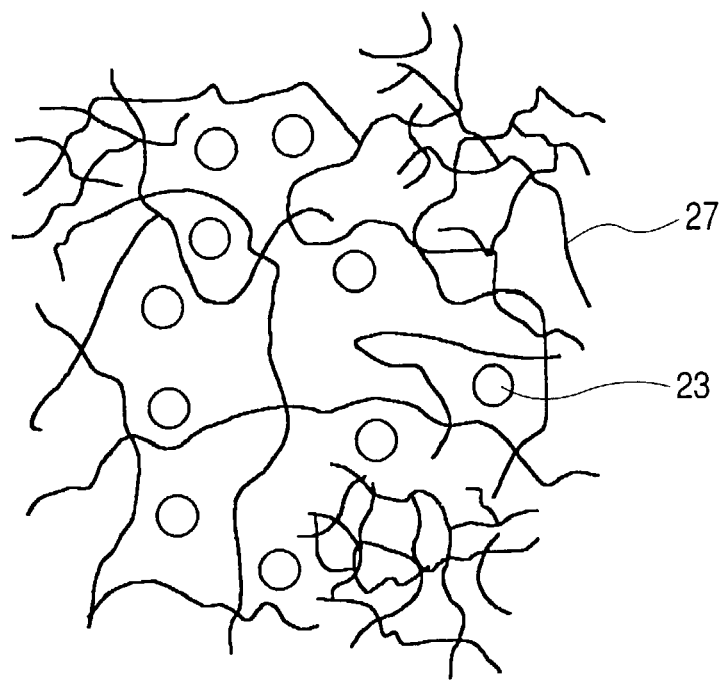
FIG. 5 is a drawing representing the configuration of general silicone adhesive.
Figure 6:
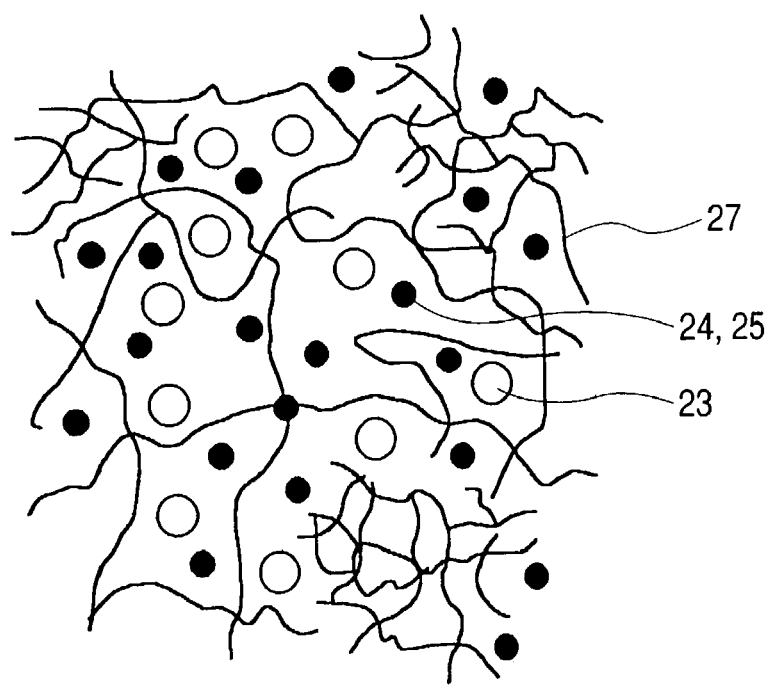
FIG. 6 is a schematic drawing showing the configuration of silicone adhesive according to the present invention.

To put it more specifically, the silicone compound such as silicone adhesive 12 is compounded with adsorbent 24 as filler. As shown in FIG. 5, the normal silicone adhesive 12 is a compound formed in such a manner that dimethyl polysiloxane polymer or methyl phenyl polysiloxane polymer 27 as base polymer is with about 10 to 60 wt % filler 23 as a reinforcing agent, as well as adhesion reinforcing agent and stabilizer. This filler 23 is impalpable powder of silicon dioxide (silica), and is generally used as industrial high molecular filler 23 under the trade name of Aerozil and fumed silica. Using impalpable powder of silica with different shapes, sizes and statuses, many companies are improving the characteristics of resin. According to the present invention, adsorbent 24 is compounded as an alternative to the silica filler 23 to be compounded with silicone resin, as shown in FIG. 6. Alternatively, silica 23 and adsorbent 24 are used together. Further, there is an effect of preventing the permeation of corrosive gas in an external corrosive environment even when silica 23, adsorbent 24 and neutralizer are used in combination, and are compounded with silicone resin.

Activated carbon 25 is most effective as the adsorbent 24 used here when consideration is given to all factors including costs and corrosive gas adsorbing effect. Activated carbon 25 is found over an extensive range from high-purity activated carbon containing very few impurities burnt at a high temperature of 1000° C. or more to activated carbon containing some impurities burnt at a temperature below 1000° C. Activated carbon material is also found in great varieties, for example activated carbon made from a palm-shell, charcoal and fibrous plant groups of various types. All of them are included in the scope of activated carbon 25 according to the present invention. Further, adsorbent 24 in addition to activated carbon 25, photocatalyst such as titanium oxide, metals having self-cleaning property such as zinc oxide, Zeolite and ion exchange resin are also included in the scope.

Figure 7:
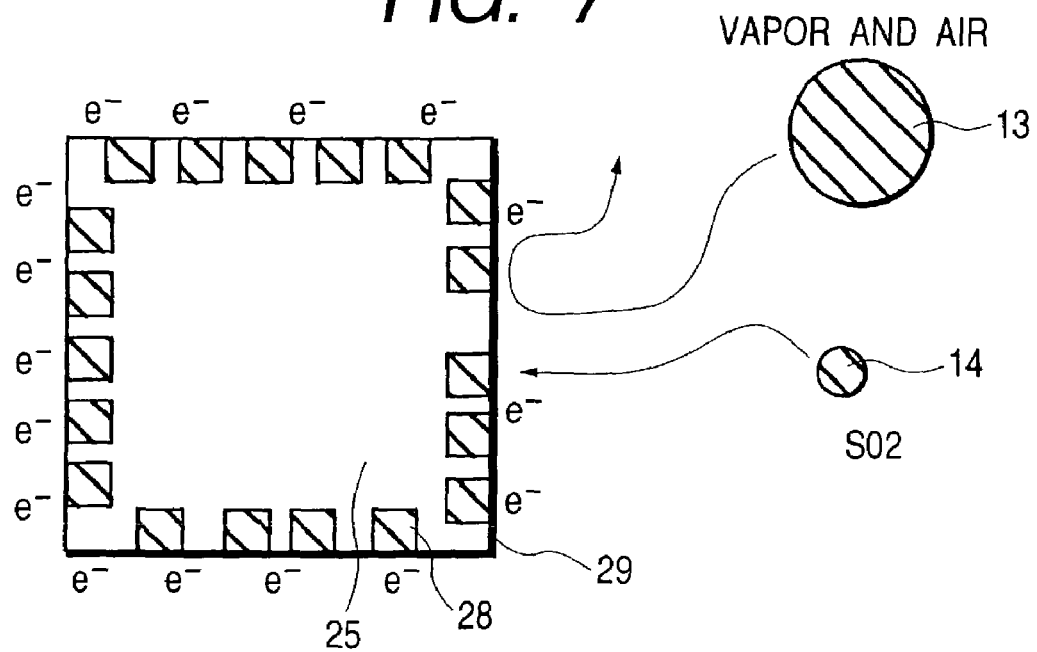
FIG. 7 is a schematic drawing representing adsorption of corrosive gas by activated carbon.
Figure 9:
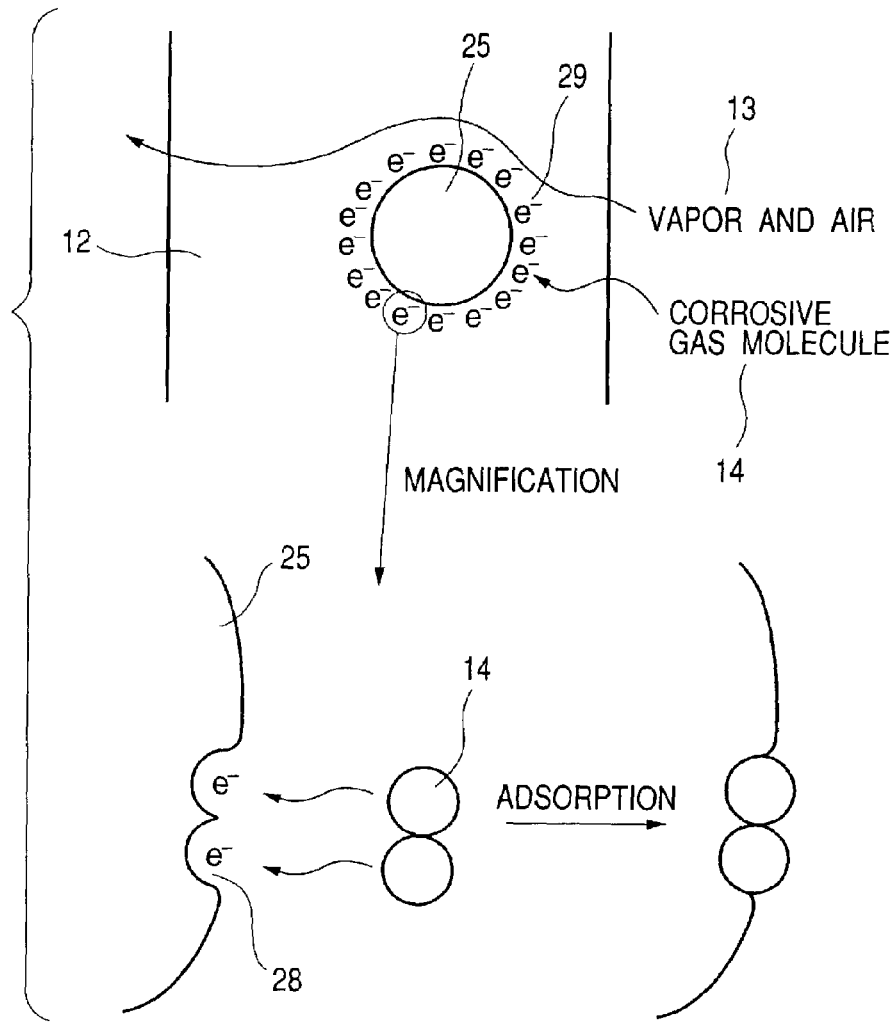
FIG. 9 is a schematic drawing representing adsorption of corrosive gas by activated carbon.

Activated carbon 25 is advantageous especially because it provides specific adsorption of the gas. If the target gas adsorbed is understood clearly, the activated carbon 25 having a high degree of adsorbing effect for the gas is compounded with silicone adhesive 12. For example, the activated carbon 25 having a high degree of adsorbing effect for sulfurous acid gas ($SO_2$) shown in FIG. 7, FIG. 9, and activated carbon having a high degree of adsorbing effect for hydrogen sulfide ($H_2O$) etc. Only the corrosive gas will be trapped if the activated carbon 25 is compounded with the silicone adhesive, and gases (such as vapor and air that are not corrosive) except the target gas (corrosive gas) are allowed to pass by since they are not adsorbed by the activated carbon 25. Thereby only sulfurous acid gas in which is corrosive gas 14 of sulfur type or hydrogen sulfide having a similar molecular structure is adsorbed. This will provide a sealing configuration characterized by a high degree of adsorbing effect and superb reliability for corrosive resistance. Activated carbon 25 has a porous surface 28. If sulfurous acid gas comes close to the activated carbon 25 having a great number of pores with a similar shape as that of sulfurous acid gas molecule on the surface thereof, then it is adsorbed by countless minus ions 29 present on the surface of activated carbon 25, and is adsorbed into pores on the surface of activated carbon 25 having a shape similar to that of sulfurous acid gas. Depending on the type of activated carbon 25, gas adsorbed into the pores on the surface of activated carbon 25 makes a chemical reaction after having been adsorbed into pores of activated carbon 25, and is converted into a different substance or is neutralized. Such an activated carbon 25 has been developed.

When consideration is given to the interior of the engine room or intake-air temperature system of a car, gases produced therein creates a corrosive environment since they are sulfur based gas 14 such as $H_2S$, $SO_2$, SOx, $CS_2$ and S8, NOx gas 13 such as NO and $N_2O$, hydrocarbon such as HC, and chlorine gas such as $Cl_2$. These corrosive gases are mixed in a complicated manner to form a composite mixed gas. If the activated carbon 25 for adsorbing gas components similar to the above-mentioned corrosive gas components is compounded, whereby corrosive gas adsorbing efficiency can be improved. A thermal type air flow meter characterized by improved reliability for corrosion resistance can be provided by sealing with silicone adhesive 12 compounded with at least two types of activated carbons 25 or neutralizers having different adsorbing effects as fillers 23.

As a matter of course, silica to be used as filler 23 originally compounded with the silicone adhesive is also porous, and is an adsorbent in a sense. It is said, however, that silica is not effective in adsorbing sulfur based corrosive gas 14. It has been verified that silica is effective in adsorbing aliphatic hydrocarbon gas or the like, and zeolite is effective in adsorbing aromatic hydrocarbon. Thus, silica as filler 23 of silicone adhesive is effective in adsorbing gases of alcohol and solvents, and is preferably used in combination with activated carbon 25. It is preferred that 5 wt % or more activated carbon 25 as filler to be mixed with silicone adhesive 12 is mixed while maintaining the function as a silicone adhesive or sealant.

One of the advantages of compounding activated carbon 25 as filler 23 is that regeneration is possible. When the adsorption power of activated carbon 25 has reached the point of saturation, it will be lost, and the filler 23 will have no function at all, as a matter of course. However, activated carbon 25 is capable of discharging adsorbed gas molecules when the temperature has exceeded a certain level or a certain external state has been reached in the saturated state. After it has discharged the gas molecules, it is refreshed and regains the adsorption power. This property makes it possible to work as an adsorbent for a long time. Activated carbon 25 is effective in maintaining reliable of such a product as a car that is used for a long time. Especially n the case of a thermal type air flow meter, gas molecules discharged by activated carbon 25 are sucked into a cylinder where it is burnt, without affecting the atmosphere very much.

Figure 8:
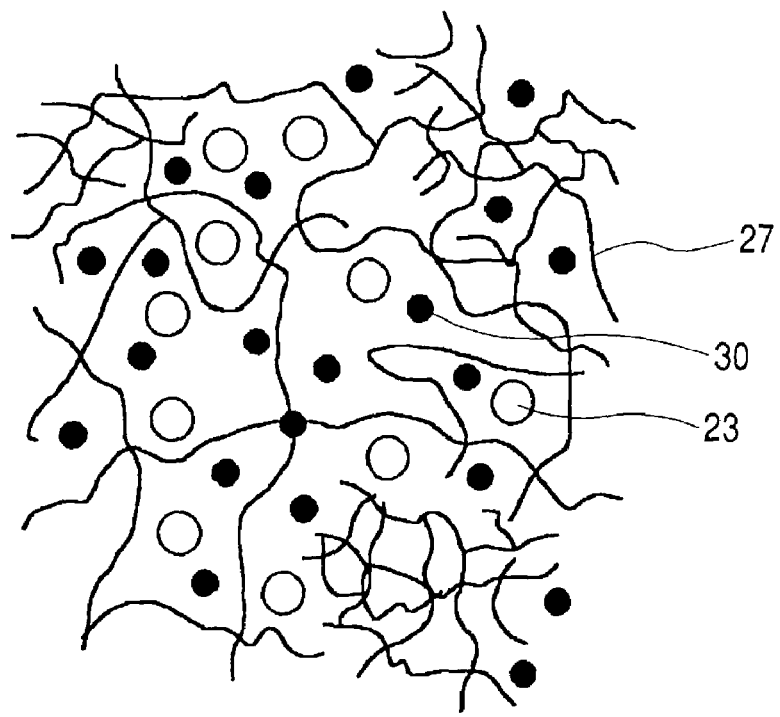
FIG. 8 is a schematic drawing representing the configuration of silicone adhesive according to the present invention.

FIG. 8 is another embodiment of the present invention shown in FIG. 6.

In this embodiment, impalpable powder 30 of at least one of Ag, Fe, Co, Ni, Cu is compounded as filler 23 with silicone resin, in addition to silica. The impalpable powder functions as the trap substance. This method is effectively especially in the case of sulfur based corrosive acid gas 14. The sulfur based corrosive acid gas 14 adsorbed on the surface of a silicone adhesive and in the process of permeation produces a direct chemical reaction with silver (or at least one of Fe, Co, Ni, Cu) impalpable powder 30 compounded in silicone adhesive to yield silver sulfide. It is turned into sulfide in the silicone and is trapped. Thus, reliability for corrosion resistance is improved by the mechanism that ensures that sulfur based corrosive gas 14 does not enter the case 3 housing a hybrid IC board 9, according to the adhesion/sealing configuration of the present embodiment.

Generally, the compound forming by mixing silver with silicone resin can be found on the market. However, such a compound is often found to be an antibacterial resin based on the sterilization function of silver, a biological resin or mildew proof resin. The present invention has been made by focusing attention to the fact that silver has a high degree of reactivity with sulfur based corrosive gas. There is no example that Fe, Co, Ni or Cu has been compounded with silicone resin as a trap substance.

Figure 10:
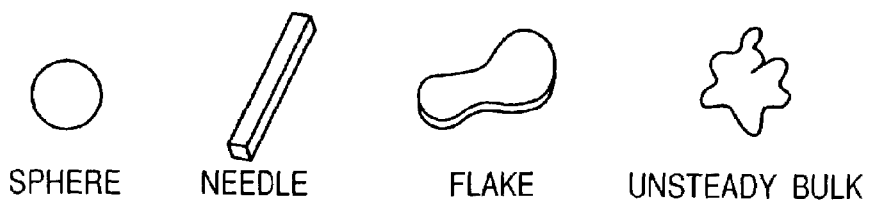
FIG. 10 is a schematic drawing representing various shape of a grain in adsorbent or trap agent.

If impalpable powder 30 of at least one of silver (Ag), Fe, Co, Ni, Cu compounded in silicone adhesive has a large size, there may be a change in the electric characteristics such as electrical insulation and conductivity that are intrinsic to silicone adhesive. For this reason, the diameter of silver is preferably 10 µm or smaller. When the shape is sphere, there is no problem. Concerning the shape of impalpable powder 30 or adsorbent 24, as shown in FIG. 10, in addition to sphere, amorphous bulk, flake, needle or unsteady bulk is also effective because it ensures a larger surface area. These purities are also important. As Ag, Fe, Co, Ni, or Cu purity is higher, the surface of impalpable powder is more activated and chemical reaction with corrosive gas becomes more active. However, for example when silver is alloyed with other metals, especially platinum group metals such as platinum, palladium and iridium, susceptibility to corrosive acid gas will be damaged, whereby chemical reaction for forming a sulfide will be damaged. This is the same as the alloys of other transition metals such as copper and gold. Therefore, silver purity is preferred to be at least 80 wt %.

In recent years, impalpable powder with resin coordinated on the surface of silver, hydrosilyl apatite silver and impalpable powder of silver with active base formed on the surface are also effective.

As described above, adsorbent 24 and/or impalpable powder 30 (at least one of Ag, Fe, Co, Ni, Cu) are compounded with silicone adhesive, and corrosive gas is adsorbed and/or trapped in the silicone adhesive, thereby preventing permeation into the case. By contrast, another embodiment is configured in such a way that adsorbent 24 as a major point of the present invention and impalpable powder 30 of silver (or at least one of Fe, Co, Ni, Cu) are compounded with the protective film for protecting the hybrid IC substrate 9 installed in the case 3. Silicone gel 22 is used as the protective film for covering the hybrid IC substrate 9 of many electronic devices on vehicle. Silicone gel 22 and silicone adhesive 12 have basically the same configuration as that for forming the main chain of polymer by the aforementioned siloxane bondage, and the difference is found only in the number of cross linking points, in many cases. Therefore, even if adsorbent 24 and impalpable powder 30 of silver are compounded with silicone gel 22, it can be used without any problem. Adsorbent 24 and impalpable powder 30 of silver (or at least one of Fe, Co, Ni, Cu) have already been described, and will not be described here to avoid duplication. A combination of adsorbent 24 compounded with silicone adhesive 12, filler of silver impalpable powder 30, and adsorbent 24 filler compounded with silicone gel 22 provides adhesion and sealing configuration characterized by a high reliability for corrosion resistance.

Further, the adsorbent 24 filler is expected to provide the same effect even when compounded with the resin forming the case member and cover member, thereby providing a car-mounted electronic device characterized by high reliability for corrosion resistance.

Figure 11:
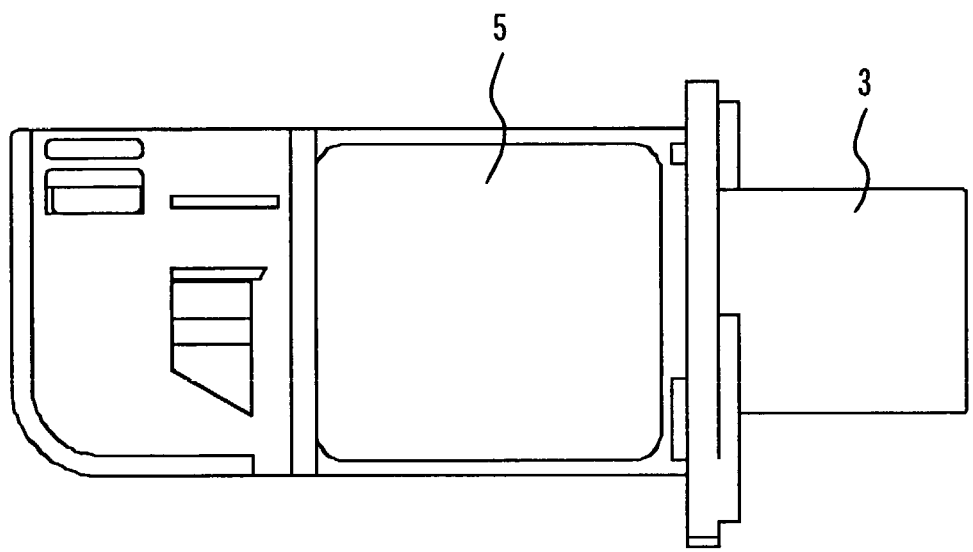
FIG. 11 is a drawing a ground plan representing airflow meter as electronic device on vehicle in another embodiment.
Figure 12:
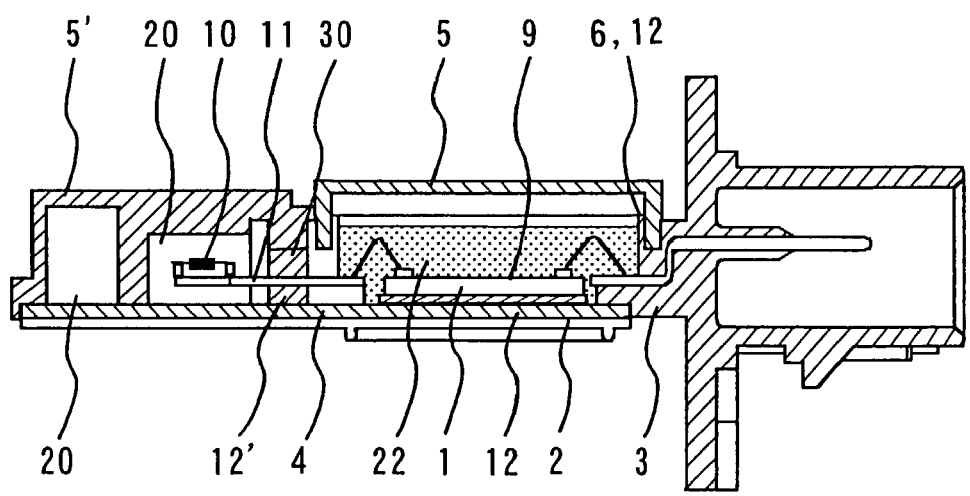
FIG. 12 is a cross sectional view of the configuration of an electronic device of FIG. 11.

The other embodiment is shown as the airflow sensor in FIG. 11 and FIG. 12.

In these Figs, the same sign as sign of above-mentioned embodiment shows the same or a common element. In this embodiment, the space surrounded by the terminals, the base 2 and the cover 5' forming sub path 20 is filled up with the sealing substance 12' having the same composition as above-mentioned adhesive 12 or sealing material.

The above-mentioned filler-containing adhesive may be configured by the following. It may be basically epoxy adhesive in which a base polymer is bisphenol A or bisphenol F. Or, it may be basically polyurethane adhesive in which a base polymer is a urethane group.

[Effects of the Invention]

The present invention provides an electronic device on vehicle characterized by a high reliability for corrosion resistance to protect the hybrid IC board mounted in the case against corrosion due to corrosive acid gas such as corrosive sulfur based compound gas, sulfur gas and nitrogen oxide gas, and alkali gas.

What is claimed is:

1. An electronic device for use in an engine room of a vehicle, said device comprising:
    a metallic base upon which a circuit board is mounted, and
    a resin case for enclosing said circuit board on said metallic base, wherein said resin case and said metallic base are bonded to each other with a silicone adhesive containing a trap agent for trapping at least one of a sulfur gas and a sulfur compound gas.

2. The electronic device according to claim 1, wherein an inside portion of said resin case is filled with a gel.

3. An electronic device for use in an engine room of a vehicle, comprising:
    a metallic base upon which a circuit board is mounted, and
    a resin case for enclosing said circuit board on said metallic base, wherein said resin case and said metallic base are bonded to each other with a silicone adhesive containing silver or silver alloy.

4. The electronic device according to claim 3, wherein said silicone adhesive contains said silver or said silver alloy together with 10 to 60 wt % of silica.

5. The electronic device according to claim 3, wherein said silver or said silver alloy is spherical, needle-shaped or flake-shaped, or is formed in an amorphous bulk whose specific surface area can be easily changed.

6. An electronic device for use in an engine room of a vehicle, comprising:
    a metallic base upon which a circuit board is mounted,
    a resin case for enclosing around said circuit board on said metallic base, and
    a resin cover for covering an opening of said resin case, wherein said resin case and said metallic base are bonded to each other with a silicone adhesive containing a trap agent for trapping at least one of a sulfur gas and a sulfur compound gas; and resin case and said resin cover are bonded to each other with an epoxy adhesive.

7. The electronic device according to claim 6, further comprising a terminal provided at said resin case or said cover for connecting to an external device, and a through portion of said terminal at said resin case or said cover is sealed with a sealing substance having the same materials as said silicone adhesive.

8. The electronic device according to claim 6, wherein an inside portion of said resin case is filled with a gel.

9. An electronic device for use in an engine room of a vehicle, comprising:
    a metallic base upon which a circuit board is mounted,
    a resin case for enclosing said circuit board on said metallic base, and
    a resin cover for covering an opening of said resin case, wherein said resin case and said metallic base are bonded to each other with a silicone adhesive containing silver or silver alloy; and resin case and said resin cover are bonded to each other with an epoxy adhesive.

10. The electronic device according to claim 9, wherein said silicone adhesive contains said silver or said silver alloy together with 10 to 60 wt % of silica.

11. The electronic device according to claim 9, wherein said silver or said silver alloy is spherical, needle-shaped or flake-shaped, or is formed in an amorphous bulk whose specific surface area can be easily changed.

12. A thermal type air flow meter comprising:
    an intake air passage for an internal combustion engine, a heating resister arranged in a sub-path of said intake air passage, a circuit board on which an electronic circuit for controlling the temperature of said heating resister is formed,
    a metallic base for mounting a circuit board, and
    a resin case for enclosing around said circuit board on said metallic base,
    wherein said resin case and said metallic base are bonded to each other with a silicone adhesive containing a trap agent for trapping at least one of a sulfur gas and a sulfur compound gas.

13. The thermal type air flow meter according to claim 12, wherein an inside portion of said resin case is filled with a gel.

14. A thermal type air flow meter comprising:
    an intake air passage for an internal combustion engine,
    a heating resister arranged in a sub-path of said intake air passage,
    a circuit board on which an electronic circuit for controlling the temperature of said heating resister is formed,
    a metallic base for mounting a circuit board, and
    a resin case for enclosing around said circuit board on said metallic base,
    wherein said resin case and said metallic base are bonded to each other with a silicone adhesive containing silver or silver alloy.

15. The thermal type air flow meter according to claim 14, wherein said silicone adhesive contains said silver or said silver alloy together with 10 to 60 wt % of silica.

16. A thermal type air flow meter comprising:
    an intake air passage for an internal combustion engine,
    a heating resister arranged in a sub-path of said intake air passage,
    a circuit board on which an electronic circuit for controlling the temperature of said heating resister is formed,
    a metallic base for mounting a circuit board, and
    a resin case for enclosing around said circuit board on said metallic base, and
    a resin cover for covering an opening of said case,
    wherein said resin case and said metallic base are bonded to each other with a silicone adhesive containing a trap agent for trapping at least one of a sulfur gas and a sulfur compound gas; and resin case and said resin cover are bonded to each other with an epoxy adhesive.

17. The thermal type air flow meter according to claim 16, wherein an inside portion of said resin case is filled with a gel.

18. A thermal type air flow meter comprising:

an intake air passage for an internal combustion engine, a heating resister arranged in a sub-path of said intake air passage, a circuit board on which an electronic circuit for controlling the temperature of said heating resister is formed, a metallic base for mounting a circuit board, and a resin case for enclosing around said circuit board on said metallic base, and a resin cover for covering an opening of said case, wherein said resin case and said metallic base are bonded to each other with a silicone adhesive containing silver or silver alloy; and resin case and said resin cover are bonded to each other with an epoxy adhesive.

19. The thermal type air flow meter according to claim 18, wherein said silicone adhesive contains said silver or said silver alloy together with 10 to 60 wt % of silica.

* * * * *